United States Patent [19]

Zimmerman et al.

[11] Patent Number: 4,464,564
[45] Date of Patent: Aug. 7, 1984

[54] CURRENT CONTROLLER FOR HEATING STAGE ON LEITZ MICROSCOPE

[75] Inventors: Wiley E. Zimmerman; Jimmy R. Alexander; Don E. Boles, all of Ponca City, Okla.; Rhea W. Bockhorst, Morgantown, W. Va.

[73] Assignee: Conoco Inc., Ponca City, Okla.

[21] Appl. No.: 437,077

[22] Filed: Oct. 27, 1982

[51] Int. Cl.³ .............................................. H05B 1/02
[52] U.S. Cl. ..................................... 219/497; 219/504; 219/506; 219/483; 219/484; 338/20
[58] Field of Search ............... 219/498, 497, 494, 504, 219/505, 506, 501, 483, 492, 484; 338/13, 20, 22 SD

[56] References Cited

U.S. PATENT DOCUMENTS

| | | | |
|---|---|---|---|
| 3,139,515 | 6/1964 | Leigh et al. | 219/504 |
| 3,413,517 | 11/1968 | Barber et al. | 315/106 |
| 3,597,652 | 8/1971 | Gates, Jr. | 315/255 |
| 3,670,202 | 6/1972 | Paine et al. | 315/297 |
| 3,805,022 | 4/1974 | Kulwicki et al. | 219/504 |
| 3,833,282 | 9/1974 | Kappl et al. | 350/87 |
| 3,833,283 | 9/1974 | Stankewitz | 350/87 |
| 3,885,194 | 5/1975 | Schumacher | 315/107 |
| 3,900,244 | 8/1975 | Wiesler et al. | 350/81 |
| 3,909,662 | 9/1975 | Thomas et al. | 315/106 |
| 3,913,055 | 10/1975 | Levinson | 338/20 |
| 3,933,408 | 1/1976 | Reinert | 350/87 |
| 4,068,281 | 1/1978 | Harnden, Jr. | 338/20 |
| 4,135,116 | 1/1979 | Smith | 315/158 |
| 4,300,037 | 11/1981 | Padden | 219/492 |
| 4,359,414 | 11/1982 | Mastrangelo | 338/20 |

*Primary Examiner*—M. H. Paschall
*Attorney, Agent, or Firm*—William J. Miller

[57] ABSTRACT

A current controller interface accepts a variable voltage at its input and develops a current at its output which corresponds directly with the input variable voltage. Its apparatus is usually associated with a program controller as an input and a microscope which has a heated element as the output. The apparatus uses a control circuit which is coupled to a controllable resistance semiconductor device, which device has an output which varies in resistance in accordance with variation in input current. The output of the variable resistance device is coupled in series with the heating coil of the microscope, the power supply and current sensing resistor. The resistor develops a feedback voltage which is applied to the control circuit so that when a change in voltage is applied to the input the output from the current sensing element will change until it balances the current being applied at the input. When the balance occurs, no further change in output current will occur.

13 Claims, 3 Drawing Figures

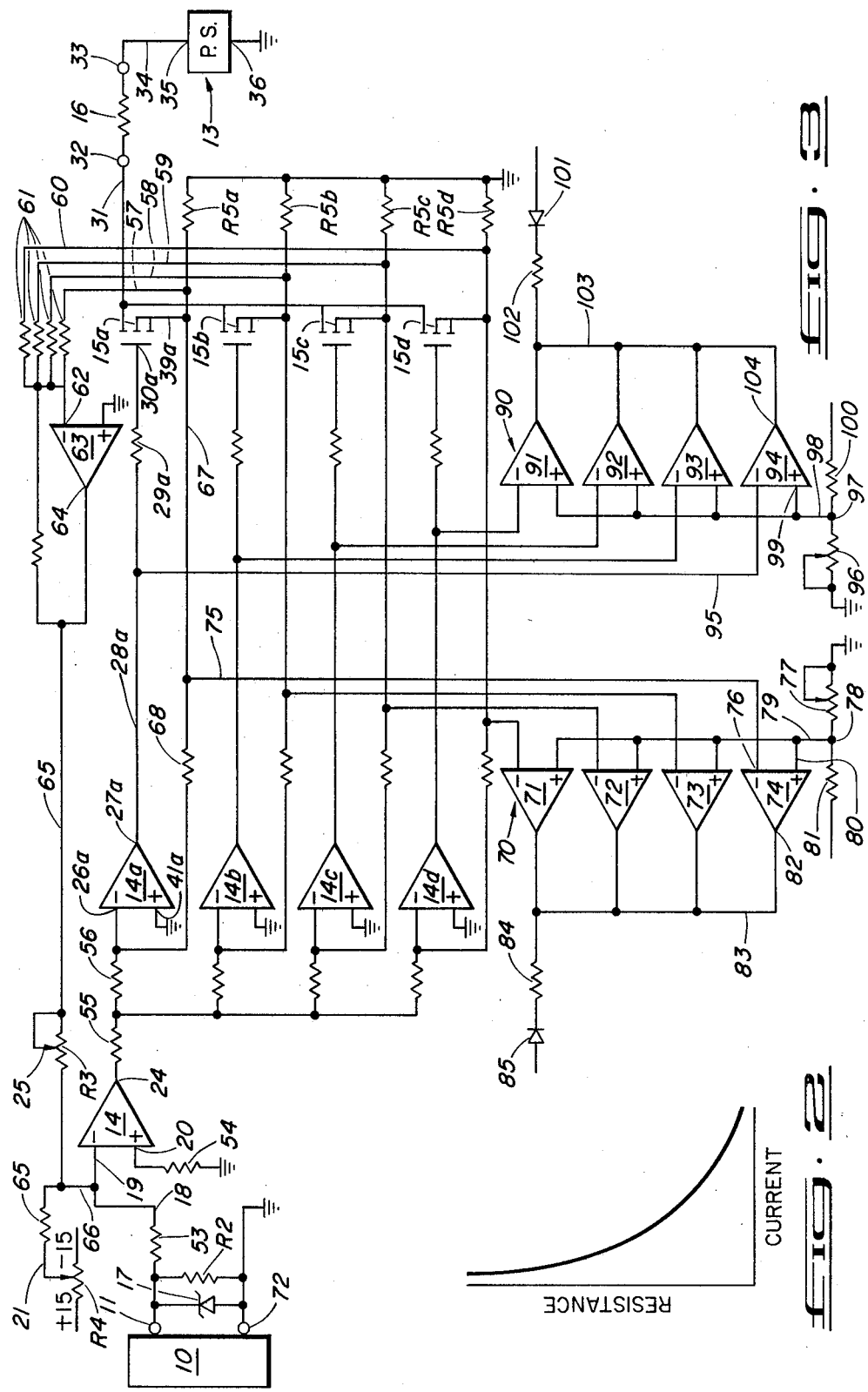

CURRENT CONTROLLER FOR HEATING STAGE ON LEITZ MICROSCOPE

BRIEF DESCRIPTION OF THE PRIOR ART

The usual way for controlling the temperature of a heater in a microscope is to incorporate a feedback sensor which measures the amount of light being emitted by the light in the microscope and compares it with a control which then regulates the light in comparison with the control. U.S. Pat. Nos. 3,670,202 and 4,135,116 are examples of such a control. U.S. Pat. No. 3,909,662 relates to an electron microscope and incorporates a current heater in a feedback circuit and regulates the current in the heater in accordance with some predetermined value. The operation of the apparatus, however, is different than that of the invention and incorporates silicone control rectifiers which are not only noisy and as a consequence generate radio interference but provide limited control and very ineffective control when low voltages are being regulated.

BRIEF DESCRIPTION OF THE INVENTION

This invention discloses an interface for coupling the output of a programmable controller to the input of a heater for a microscope. The interface comprises a control circuit which has an input coupled to the output of the programmable controller and an output consisting of a controllable variable resistance semiconductor apparatus. The apparatus has its output coupled to the microscope heater in series with a power supply and a current sensing resistor. The current sensing resistor supplies feedback to the control circuit so that when the heater has reached the proper heat as determined by the programmable controller a balance will be reached between the output from the current sensing resistor and the input to the control circuit. When this occurs the current through the heater will reach a steady state. Other features are included such as a circuit which warns the operator that one of the controllable variable resistor semiconductor devices has either opened or shorted.

BRIEF DESCRIPTION OF THE FIGURES

FIG. 2 is a resistor current plot of a controllable variable resistor semiconductor apparatus; and FIG. 3 is a schematic diagram of the preferred embodiment of the interface apparatus.

DETAILED DESCRIPTION OF THE INVENTION

Figure 1:
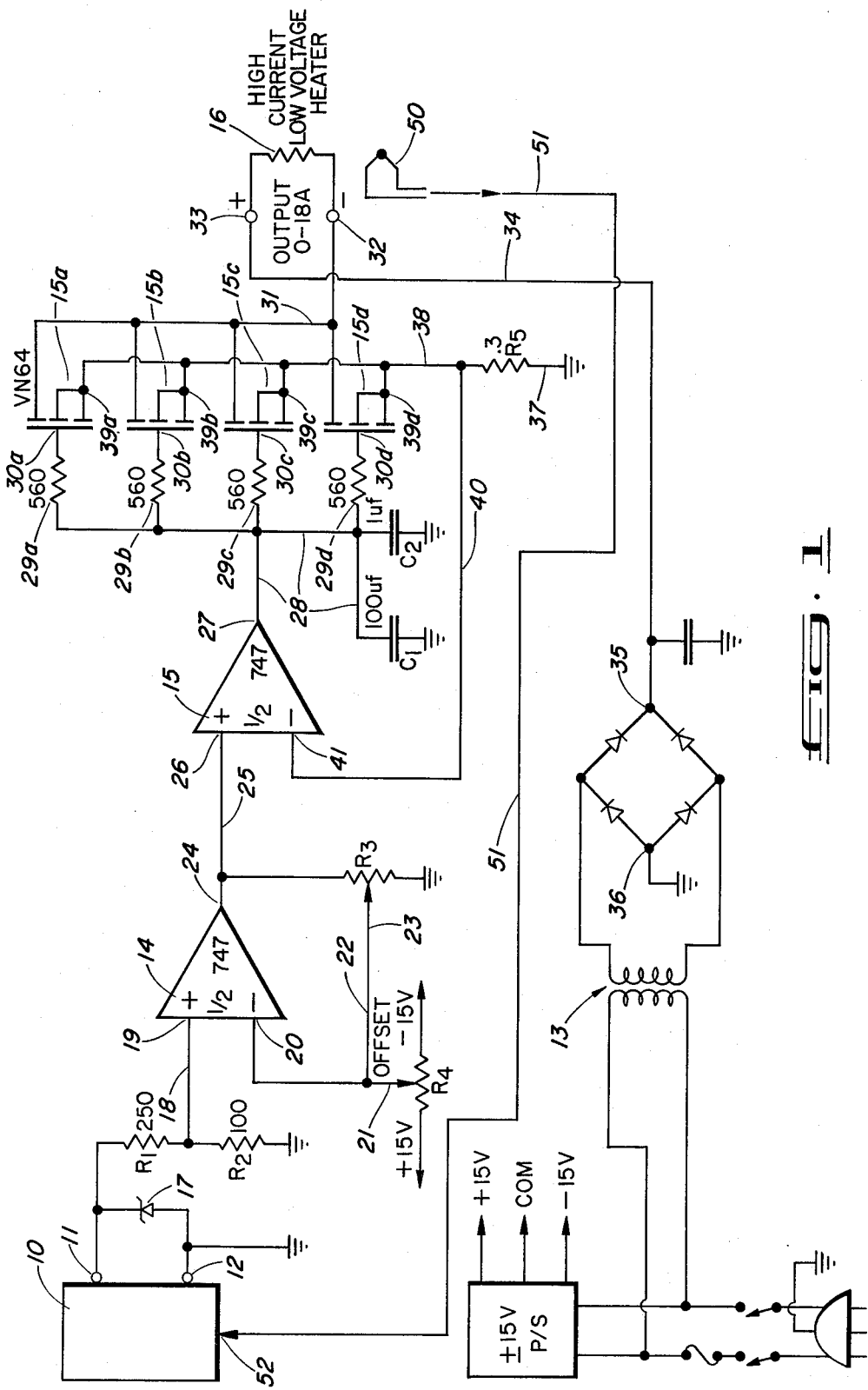
FIG. 1 is a schematic drawing of one embodiment of the interface apparatus.

Referring to all of the figures but in particular to FIG. 1 a programmable controller 10 is coupled through terminals 11 and 12 as an input to the interface apparatus. The interface apparatus generally consists of a power supply referred to by arrow 13, an op amp 14, a second op amp 15 along with its control circuitry comprise the control circuit means for the interface. A plurality of controllable variable resistance means 15a, 15b, 15c, and 15d, basically, provide the overall control for the high current, low voltage heater 16. Returning to input terminals 11 and 12, a zener diode 13 is connected across terminals 11 and 12 to protect the amplifier from overvoltage. Resistors R1 and R2 provide a voltage divider for op amp 14. A wire 18 connects voltage dividers R1 and R2 to an input 19 of op amp 14. A second input 20 is connected to the sliding arm 21 of variable resistor R4. The stationary sides of resistor R4 are connected to a plus and minus 15 volts, respectively. Wire 22 also is coupled to a sliding arm 23 of resistor R3. The stationary portion is connected between an output 24 of op amp 14 and ground. The output 24 of op amp 14 is connected through wire 25 to an input 26 of op amp 15. An output 27 of op amp 15 is coupled through a wire 28 to a plurality of resistors 29a, 29b, 29c, and 29d. Wire 28 is also coupled to capacitors C1 and C2. Resistors 29a through 29d are coupled to the control inputs 30a through 30d of controllable variable resistance means 15a through 15d. The output of variable resistor means 15a through 15d is coupled through wire 31 to one side of the microscope heater 32. Output terminal 33 is coupled through a wire 34 to the output 35 of power supply 13. The ground terminal 36 of power supply 13 is connected to the ground portion 37 of a current sensing means R5 which is coupled through wire 38 to the other output terminal 39a through 39d of controllable variable resistance means 15a through 15d. The output voltage developed across current sensing means R5 is supplied through a wire 40 to an input 41 of op amp 15.

Operation of FIG. 1

A programmable controller is an apparatus readily available, an example of which is manufactured by Honeywell and referred to as a digital control programmer DCP 7700 and is a microprocessor device that is a single variable set point versus time programmer and includes 1, 2, or 3 mode controllers combined into one digital instrument. It generates and controls a process variable versus time profile for various applications. It can, for example, generate a steady increase in voltage versus time, a constant voltage versus time (called soak) causing other increases or decreases of constant voltage depending upon the particular program required by the operator. The current output from such an apparatus is generally between 4 and 20 milliamps. Such apparatus, however, does not have sufficient current to operate a heater for a microscope such as a Leitz microscope heater. Such a heater requires in the order of 0 to 18 amperes. The heat control requirements are generally extremely precise and must be within 1/10 of 1° C. Silicone control rectifiers (SCR's) cannot control such high currents and maintain extremely accurate temperature control on this application (plus or minus 1/10° C.) since SCR's, even when turned on at the zero crossing, zero crossing firing of an SCR, will generate too much heat for one half a power line cycle. Phase control of an SCR generates radio frequency interference and does not operate reliably as a control device for low voltage levels. The control of the field effect transistors causes a change in the resistance of the device from very high resistance with no voltage (see FIG. 2) to a low resistance with a high voltage at the input. A device preferred in this invention is a VN64 manufactured by Siliconix of Santa Clara, Calif.

Input voltage from programmable controller 10 is applied across resistors R1 and R2, reduced by taking only a portion of the voltage that appears across resistor R2 and applying it through wire 18 to one of the inputs 19 of operational amplifier (op amp) 14. When the programmable controller has a minimum of 4 milliamps current proper control requires no current should be flowing through high current heater 16. A means must be provided for controlling op amp 14 in such a manner that it has no output at 24 with 4 milliamps input between terminals 11 and 12. This control is provided by resistor R4 where a voltage is selected by a sliding arm 21 until the voltage at input 20 equals the voltage at input 19 with 4 milliamps input between terminals 11 and 12. The total gain through op amp 14 is provided by resistor R3 and is selected by movement of sliding arm 23 which is coupled through wire 22 to input 20. The circuit through R3 provides feedback from the output to the input of op amp 14. It is obvious that the higher the feedback the less the amplification of op amp 14. The output 27 from op amp 14 is connected through wire 28 through resistors 29a through 29d to the inputs 30a through 30d of controllable variable resistance means 15a through 15d. The heater current 16 is then controlled by a series circuit which comprises terminal 32 which is coupled through wire 31 to the output 39a through 39d of controllable variable resistance means 15a through 15d, then through wire 28 through current sensing means R5, wire 37 through ground, to terminal 36 of power source 13 through terminal 35 of power source 13 through wire 34 to terminal 33 which is coupled to heater 16. Any current passing through R5 generates a voltage across R5 and functions as an indication of the current being applied to the heater 16. This measure of current is passed through wire 40 to the second input 41 of op amp 15. The sequence of the operation of the system is as follows:

It is assumed at this point in time that the feedback voltage across R5 is being applied to input 41 balancing the voltage being supplied at input 26 under a balance condition, that is, the current at 41 and 26 is the same. For 8 milliamp output current from the controller 1d inputs on IC 15 are balanced and output 27 will be zero or nearly zero causing the resistance of controllable resistance 15a through 15d to be extremely high (see FIG. 2).

Any increase of voltage at terminals 11 and 12 over 4 milliamps will cause an increase in voltage at input 19 which will be greater than the voltage set at R4 and applied to input 20. A difference in voltage between inputs 19 and 20 will cause an output at 24 which will be communicated to input 26 of op amp 15.

An increase in voltage at input 26 of op amp 15 will develop an output at terminal 27. This will be reflected at input 30a through 30d of controllable resistance 15a through 15d with an increase in voltage at the inputs. The resistance will drop in each of the resistors 15a through 15d causing an increase in current through the previously-mentioned series output circuit. This increase in current will be immediately reflected in an increase in current through op amp 15 which will be immediately reflected at input 41 of op amp 15. Once this occurs, op amp 15 will cause the output at 27 to reduce, increasing the resistance of each of the controller resistors 15a through 15d. The overall heating being developed by a high current heater 16 is reflected in a thermocouple 50 coupled through a wire 51 to a thermocouple input 52 of programmable controller 10. If the overall heat of heater 16 as referenced by thermocouple 50 is not proper in accordance with program of 10, then additional voltage will be applied between 11 and 12 causing the sequence of events, as previously described, and additional current to pass through 15a through 15d again increasing the current through heater 16 elevating its temperature. It is obvious that as the temperature gradually increases, the variation in current through R5 caused by the change in resistance of controller resistors 15a through 15d will be reflected continuously into input 41 of op amp 15. If op amp 15 reduces the current by an appreciable amount, the overall heat in heater 16 will reduce; however, thermocouple 50 will sense the reduction in heat and the temperature controller will cause voltage at 26 to increase with the circuit repeating itself so, basically, the system will be a slight oscillation above or below the predetermined set point, whether it is an increase in ramp or a steady state condition; however, these oscillations should not exceed 1/10 of 1° C.

DESCRIPTION OF THE PREFERRED EMBODIMENT

Similar numbers will be used for similar elements.

The preferred embodiment illustrated in FIG. 3 functions slightly different than that described in FIG. 1; however, the overall configuration and general operation is substantially the same. As previously described, program controller 10 develops an output at terminals 11 and 12 which are again voltage limited by diode 17. The output is, however, in the preferred embodiment, applied directly across resistor 2 with resistor 53 connected in series through wire 18 to terminal 19 of op amp 14. Terminal 20 is connected directly through resistor 54 to ground. The output 24 of op amp 14 is connected through a pair of resistors 55 and 56 to the input 26a of op amp 15. Input 41a is connected directly to ground while output 27a is connected through resistor 29a to controllable variable resistance means 15a. The input of resistance means 15a is connected through wire 31 to terminal 32 which is coupled to a high current heater 16 to terminal 33 through a wire 34 to terminal 35 to power supply 13. The remaining terminal 36 is coupled to ground. Connections to balance 15b, 15c and 15d are connected, respectively, to variable resistance means 15b, 15c, and 15d, respectively. Since the connections to each of the amps and each of the resistance means are identical to that previously described, no further description will be given. Instead of a single sensor measuring R5, a plurality of current sensing means R5a through R5d are connected, respectively, to each variable resistance means 15a through 15d. The outputs from each of the current sensing means R5a through R5d are coupled through wires 57, 58, 59, and 60, respectively, to resistors 61 to the input 62 of op amp 63. The summed output is applied to output terminal 64 to wire 65 through the gain adjust resistor R3 to the input 19 of op amp 14. The offset adjust potentiometer R4 is coupled through sliding arm 21, resistor 65, through wire 66 to the input 19 of op amp 14.

OPERATION

The circuit operates in a similar fashion to the circuit described in FIG. 1. One of the problems with the circuit in FIG. 1 is the sharing of the load of each of the controllable variable resistors 15a through 15d. If, on occasions, voltage should get a little high at any of the inputs 30a through 30d for a particular controllable resistor, then that resistor's resistance would be lower than any of the other controllable resistors. On such an occasion it would tend to carry the majority of the current and if the current becomes significant the variable resistor could overload and be destroyed causing the entire circuit to fail.

In the embodiment illustrated in FIG. 3, each of the controllable resistors 15a through 15d is controlled by its own op amp 14a through 14d, respectively. Furthermore, each op amp controllable resistor combination has its own current sensing resistor 5a through 5d, respectfully. The output from each of the 4 current sense resistors is summed and applied through amplifier 63 to the input 19 of op amp 14. Control for each variable resistance is demonstrated by the control for 15a which is provided through output 39a, wire 67, resistor 68, to input 26a of op amp 14a. Thus, any change in individual currents through the controllable resistor 15a which is reflected in a voltage developed across resistor 5a will be supplied through wire 67 and resistor 68 to the input 26a of op amp 14a. For example, if the current through resistor 5a should increase over the current being supplied at input 26a from op amp 14, then the voltage supplied along wire 67 which has the opposite polarity of the voltage being supplied from op amp 14 will cause a decrease in the output voltage appearing at output 27a. This output voltage decrease will be applied to the control input 30a of variable resistance 15a causing its resistance to increase, thereby causing a reduction in voltage across resistor 5a; therefore, any individual change in the balance of current being supplied through each of the currents 15a through 15d will be immediately corrected by the feedback being applied to its control operational amplifier 14a through 14d. The above circuit will then tend to keep each of the controllable resistors in balance as well as deliver a total current through the feedback circuit to op amp 14 so that the overall control of the heating process can be controlled as previously described.

Safety Circuit

The above circuit also features a safety circuit which will warn when any controllable resistor has either shorted or opened, causing undue currents to flow in the remaining resistors in the case of open or excessive currents to flow in case of a shorted variable resistor. The circuit initially consists of an op amp having four amplifiers contained within it and is of an LM339 type referred to generally by arrow 70 and comprises amplifiers 71, 72, 73, and 74. The amplifiers are designed to detect an overcurrent situation which would be indicative of a shorted controllable resistor. Since each controllable resistor and its warning will function in identical manner, only one such function will be described. Wire 75 is coupled from wire 67 to input 76 of amplifier 74. An adjusting apparatus comprising a variable resistor 77 is connected at junction 78 to wire 79 which is connected to a second input 80 of amplifier 70. Junction 78 is then connected to a resistor 81 to the source of voltage. The output 82 from amplifier 74 is coupled through wire 83 and resistor 84 to a light emitting diode 85 and then to a source of power. The short warning system operates in the following manner:

Resistor 77 is adjusted so that the voltage at the input 80 is equal to or greater than the voltage at input 76. In case control variable resistor 15 fails by shorting the voltage, wire 75 will increase to a high potential. This increase in potential will be reflected at input 76 causing amplified 74 to draw current through diode 85, resistor 84 through wire 83 to the output 82 causing light emitting diode 85 to emit. The overvoltage comprises an amplifier 90 which is also LM 339 and comprises amplifiers 91, 92, 93, and 94 connected as previously described to each of the controllable resistors 15a through 15d. With amplifier 94 as an example, wire 95 is connected to wire 28a. Adjustable resistor 96 is connected to 97 and wire 98 to input 99 of amplifier 94 and through resistor 100 to a source of power. When controller resistor 15a opens, for example, and will no longer draw current, the voltage on wire 95 will go high. Resistor 96 has been adjusted so that the voltage on wire 98 and input 99 was equal to or greater than the voltage on the other input terminal of amplifier 94. When the voltage on wire 95 went high, current passes from a source of power through a LED 101, resistor 102 and wire 103 to output 104 of amplifier 94 across LED 101 to cause it to emit light, indicating that the circuit has failed in an open condition.

We claim:

1. Apparatus for coupling the output from a programmable controller to the input of a heating means comprising:
   (a) control circuit means having an input means coupled to the output of said programmable controller and an output;
   (b) controllable variable resistance transistor means having an electrical control input means coupled to said output of said control circuit means and an output which varies in resistance in accordance with a signal at its electrical control input means;
   (c) current sensing means generating an output proportional to the current passing through the output of said controllable variable resistance means;
   (d) means coupling a source of power through the input of said heater means, through said controllable variable resistance means and through said current sensing means to said source of power; and
   (e) means coupling the output from said current sensing means to said input means of said control circuit means, whereby an increase in signal output from said programmable controller will cause said control circuit means to reduce the resistance of said controllable variable resistance means causing said current sensing means to generate a response to the input means of said control circuit means balancing the input.

2. Apparatus as described in claim 1 wherein said control circuit means comprises:
   (a) a first and second amplifier means each having an input and an output means; and
   (b) means coupling the output of said first amplifier means to the input of said second amplifier means, and wherein said output from said current sensing means is coupled to said input of said first amplifier means along with the input from said programmable controller, whereby a difference in voltage caused by said programmable controller output and said current sensing means causes an output from said first and second amplifier means to said controllable variable resistance means in a direction to minimize said voltage difference.

3. Apparatus as described in claim 1 wherein said controllable variable resistance means comprises a plurality of parallel controllable variable resistance transistor means, each of which is coupled through a current sensing means and each of which is controlled by an amplifier means, a summing circuit having the outputs from each current sensing means applied to an input of said summing means with an output of said summing means coupled to the input means of said control circuit means.

4. Apparatus as described in claim 2 wherein said controllable variable resistance transistor means comprises a plurality of parallel controllable variable resistance transistor means, each of which is coupled through a current sensing means and each of which is controlled by an amplified means, a summing circuit having the outputs from each current sensing means applied to an input of said summing means with an output of said summing means coupled to the input means of said control circuit means.

5. Apparatus as described in claim 3 or 4 wherein overvoltage means having an output is coupled across said controllable variable resistance transistor means and indicator means coupled to said output for indicating an overvoltage condition on any of said plurality of controllable variable resistance transistor means.

6. Apparatus as described in claim 3 or 4 wherein undervoltage means having an output is coupled across said controllable variable resistance transistor means and indicator means coupled to said output for indicating an undervoltage condition on any of said plurality of controllable variable resistance transistor means.

7. Apparatus as described in claim 3 or 4 wherein overvoltage means having an output is coupled across said controllable variable resistance transistor means and indicator means coupled to said output for indicating an overvoltage condition on any of said plurality of controllable variable resistance transistor means and undervoltage means having an output is coupled across said controllable variable resistance transistor means and indicator means coupled to said output for indicating an undervoltage condition on any of said plurality of controllable variable resistance transistor means.

8. Apparatus as described in claim 1 wherein a current balancing means is coupled to the input of said controllable circuit means whereby a predetermined current from said programmable controller will cause substantially no current to flow through said heating means.

9. Apparatus as described in claim 1 wherein control circuit means comprises:
(a) first and second amplifier means each having an input and an output means, wherein said input from said first amplifier means is coupled to said programmable controller; and
(b) means coupling said output means of said first amplifier means to the input means of said second amplifier means and wherein said output from said current sensing means is coupled to said input means of said second amplifier means, whereby a difference in current caused by said programmable controller output will result in a corresponding change in current at the output of said first amplifier which will cause a corresponding change in resistance of said controllable variable resistance transistor means in a direction to cause a current from said current sensing means to balance the said current from said first amplifier output means.

10. Apparatus as described in claim 9 wherein a current balancing means is coupled to the input of said controllable circuit means whereby a predetermined current from said programmable controller will cause substantially no current to flow through said heating means.

11. Apparatus for accepting a variable voltage at its input and developing a current at its output which varies in direct correspondence to said variable voltage comprising:
(a) control circuit means having an input means coupled to said apparatus input and an output means;
(b) controllable resistance transistor means having an input coupled to the output of said control circuit means and an output means;
(c) apparatus output means adapted for connection to a circuit requiring said controlled current;
(d) a source of current;
(e) current sensing means;
(f) means connecting in series said apparatus output means, said current sensing means, and said source of current, said current sensing means having an output current corresponding to the current through said series connection; and
(g) means coupling the output from said current sensing means to the input means of said controllable circuit means, whereby a change in the voltage applied to the input to said apparatus will cause a corresponding change in current at said apparatus output which will cause a change in current from said current sensing means until said current from said current sensing means balances the current developed from said applied voltage at the input of said apparatus.

12. Apparatus as described in claim 11 wherein said control circuit means comprises first and second amplifier means each having input and output means, means for coupling the output of said first amplifier means to the input of said second amplifier means, means for coupling the apparatus input and said current sensing means output to the input of said first amplifier means, and means for adjusting said second amplifier input so that substantially no current flows through said series connection means at a predetermined voltage at said apparatus input.

13. Apparatus as described in claim 11 where said control circuit means comprises first and second amplifier means, each having input and output means, means for coupling the output means of said first amplifier to said input means of said second amplifier, means for coupling the apparatus input to said first angle for input, means for coupling the output from said current sensing means to said second amplifier input means and means coupled to said first amplifier means for adjusting the gain of said amplifier and for adjusting the current through said series connection to substantially zero at some predetermined value of voltage at said apparatus input.

* * * * *